United States Patent
Zhou et al.

(10) Patent No.: US 12,035,510 B2
(45) Date of Patent: Jul. 9, 2024

(54) COLD PLATE WITH EMBEDDED POWER DEVICE, DRIVER CIRCUIT, AND MICROCONTROLLER WITH 3D PRINTED CIRCUIT BOARD

(71) Applicant: Toyota Motor Engineering & Manufacturing North America, Inc., Plano, TX (US)

(72) Inventors: Feng Zhou, Ann Arbor, MI (US); Hiroshi Ukegawa, South Lyon, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 17/541,727

(22) Filed: Dec. 3, 2021

(65) Prior Publication Data

US 2023/0180442 A1  Jun. 8, 2023

(51) Int. Cl.
*H05K 7/20* (2006.01)
*H05K 1/02* (2006.01)
*B33Y 80/00* (2015.01)

(52) U.S. Cl.
CPC ....... *H05K 7/20509* (2013.01); *H05K 1/0272* (2013.01); *B33Y 80/00* (2014.12)

(58) Field of Classification Search
CPC .......... H05K 7/20509; H05K 1/0272
See application file for complete search history.

(56) References Cited

U.S. PATENT DOCUMENTS

| | | | |
|---|---|---|---|
| 2012/0050990 A1 | 3/2012 | Kaslusky et al. | |
| 2016/0037680 A1 | 2/2016 | Hou et al. | |
| 2017/0341638 A1* | 11/2017 | Sawada | H05K 7/209 |
| 2018/0024599 A1* | 1/2018 | Sakata | F28F 3/06 |
| | | | 361/679.47 |
| 2019/0036337 A1* | 1/2019 | Zhang | B29C 64/227 |
| 2019/0122897 A1* | 4/2019 | Barry | H01L 24/82 |
| 2021/0112686 A1 | 4/2021 | Dogruoz et al. | |

FOREIGN PATENT DOCUMENTS

| | | |
|---|---|---|
| DE | 202009016531 U1 | 4/2011 |
| JP | H07194139 A | 7/1995 |
| JP | 2001086769 A | 3/2001 |
| WO | 9611105 A1 | 4/1996 |
| WO | 2020193466 A1 | 10/2020 |

* cited by examiner

*Primary Examiner* — Mukundbhai G Patel
(74) *Attorney, Agent, or Firm* — Dinsmore & Shohl LLP (57) ABSTRACT

An integrated power electronic package includes a cold plate having a microcontroller, driver circuit, and power module embedded within a top surface of the cold plate. A 3D-printed circuit board is printed on and/or around the microcontroller, driver circuit, and power module to create electrical connections between the components. Additional electrical components are mounted to the 3D-printed circuit board to form the integrated power electronics package. The cold plate further includes a hollow interior recess having a plurality of fins. The plurality of fins have varying densities to allow targeted cooling of the microcontroller, driver circuit, and power module embedded in the cold plate.

16 Claims, 7 Drawing Sheets

COLD PLATE WITH EMBEDDED POWER DEVICE, DRIVER CIRCUIT, AND MICROCONTROLLER WITH 3D PRINTED CIRCUIT BOARD

TECHNICAL FIELD

The present specification generally relates to cooling devices for embedded electronic devices, and more specifically, to cold plates and methods of forming cold plates.

BACKGROUND

In electrified vehicles, such as autonomous driving vehicles for mobile service, compactness of the electric drive train may be desired. As integrated power electronics are gradually shifted from silicon ("Si") devices to silicon carbide ("SiC") devices, the heat flux of the devices increase due to the decreasing footprint of the devices, which creates a need for aggressive cooling. In these power electronics, each layer between the heat source (power device) and heat sink (cold plate) contribute to the overall thermal resistance of the device. Additionally, power electronic devices commonly feature other components that emit heat and may require cooling, such as driver integrated circuits ("IC") and microcontrollers. Accordingly, compact integrated power devices having embedded power devices and electronic components, and cold plates for cooling such power devices and electronic components may be desirable.

SUMMARY

In embodiment, a device is disclosed. The device may include a cold plate having a plurality of cavities formed in a top surface of the cold plate. At least one microcontroller may be bonded to at least one of the plurality of cavities, such that the at least one microcontroller is embedded in the top surface of the cold plate. At least one integrated circuit may be bonded to at least one of the plurality of cavities, such that the at least one integrated circuit is embedded in the top surface of the cold plate. At least one power module may be bonded to at least one of the plurality of cavities, such that the at least one power module is embedded in the top surface of the cold plate. The at least one microcontroller, at least one integrated circuit, and at least one power module are connected via a 3D-printed circuit board formed on the top surface of the cold plate.

In another embodiment, a device is disclosed. The device may include a cold plate having at least one microcontroller, at least one integrated circuit, and at least one power module embedded in a top surface of the cold plate. The cold plate may further have a hollow interior recess positioned beneath the top surface of the cold plate, and a plurality of fins may be positioned within the hollow interior recess of the cold plate. An inlet and an outlet may be fluidly coupled to the hollow interior recess of the cold plate. The density of the plurality of fins may vary throughout the hollow interior recess of the cold plate.

Additionally, a method is disclosed. The method may involve forming a cold plate having a plurality of cavities in a top surface of the cold plate. The method may further involve embedding at least one microcontroller into at least one of the plurality of cavities, embedding at least one integrated circuit into at least one of the plurality of cavities and embedding at least one power module into at least one of the plurality of cavities. The method may also include printing, using a 3D-printer, a circuit board on top of and/or around the at least one microcontroller, at least one integrated circuit, and at least one power module embedded in the top surface of the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments disclosed herein relate to cold plates, devices that include cold plates, and methods of forming cold plates. More specifically, the present disclosure relates to a cold plate having a plurality of fins configured to cool power devices and electronic components embedded in the cold plate. In some embodiments, the cold plate may include power devices, microcontrollers, driver ICs, and/or other power electronic components. In these embodiments, the cold plate may include a plurality of cavities, which may be configured to receive at least a portion of the power devices and electronic components therein such that the components are at least partially embedded in the cold plate. The cold plate may be formed using conventional fabrication methods or using additive manufacturing methods.

As described in more detail herein, 3D-printed dielectric layers and conductor layers of printed circuit board (PCB) may be formed on top of the cold plate to connect the electronic components and power devices and to lay out a driver, controller circuit, or other similar circuit in the PCB. In some embodiments, the electronic components may include a flip chip package structure, ball grid array (BGA) structure, or quad flat package (QFP) for connecting the components to the 3D-printed PCB. Additional devices, such as resistors and capacitors, may be mounted to the 3D-printed PCB.

The term "additive manufacturing" refers generally to manufacturing processes where successive layers of material is provided, one on the other, to build up a three dimensional component layer-by-layer. The layers generally fuse together to form a monolithic component. Examples of additive manufacturing techniques include Fused Deposition Modeling (FDM), Selective Laser Sintering (SLS), 3D printing such as by inkjets and laserjets, Sterolithography (SLA), Direct Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM, Direct Metal Laser Melting (DMLM), etc. The additive manufacturing processes may allow use of multiple different materials to build a single component.

As provided herein, the term "3D-printed" may refer to an additive manufacturing process used to create a desired object, such as a cold plate or PCB, by stacking (e.g., printing) a plurality of layers of plastic, resin, metal, or the like, to create a solid three-dimensional part. The 3D-printing process may involve generating a digital model, such as a computer-aided design (CAD) model, which may be broken down into a plurality of horizontal layers to create a template for the 3D printer device to follow.

3D-printing may be specifically advantageous for the formation of cold plates. Notably, there is an increasing demand to make cold plates which are more compact and efficient than those achievable using conventional forming processes, which often require multiple forming steps such as forming, welding, and the like. 3D-printed cold plates may also offer increased thermal performance by utilizing complex geometries that are not achievable using conventional fabrication techniques. For example, 3D-printed cold plates have a much smaller attainable thickness than those plates formed using conventional techniques. By utilizing smaller features, it may be possible to create more intricate flow channels within the cold plate, such that the total surface area of the plate is increased. The increase in surface area may in turn increase the amount of heat which may be removed by the plate, thereby increasing the thermal performance of the plate.

Furthermore, 3D-printed cold plates may be lighter and more compact than conventionally formed cold plates. For example, the ability to form unique shapes and internal features provided by 3D-printing allows for cold plates which utilize less material, such that the plates are lighter and more compact. Additionally, 3D-printed cold plates may be formed as monolithic structures, such that the plate does not include any joined sections, openings, and/or the like which may result in loss of heat transfer or the escape of coolant (e.g., fluid). This is a stark improvement over conventionally formed cold plates, which are often formed by at least two shells having a number of seals and/or joints which may be prone to leakage.

Finally, 3D-printed cold plates benefit from a simplified production process. Notably, the process of 3D-printing cold plates alleviates the need for forming, brazing, welding, and the like, all of which are expensive and time-consuming endeavors, and allows for streamlined production of cold plates.

Utilizing 3D-printed PCBs may provide similar advantages. Unlike traditional methods, lamination methods that use laser drilling and electroplating, 3D-printing the PCB directly onto the cold plate allows the PCB to have an asymmetric geometry. For example, the process of 3D-printing a PCB on and around the electronic components described in detail herein enable to components to be seamlessly embedded in the PCB.

A 3D-printing device may be configured to deposit conductive, insulating, and supporting materials to form a PCB without being constrained by various restrictions associated with traditional lamination methods. Instead, a 3D-printing device is capable of printing both conductive material and insulation material within a single layer. Additionally, the 3D-printing device is capable of varying all three dimensions of a conductive portion of the PCB in a 3 dimensional space (e.g., in the X, Y, and/or Z directions) as the conductive portion is formed. Accordingly, instead of forming a plurality of relatively small vias between conductive layers within a laminated PCB to provide electrical and/or thermal conductive paths, a 3D-printed PCB may be formed with a single large conductive portion. The single large conductive portion reduces the electrical and thermal resistance paths within the PCB by eliminating unnecessary layers between the embedded power devices and the cold plate or other heat-extracting surface of the PCB. Additionally, conductive paths formed using 3D-printing processes are not limited to conductive planes and generally perpendicular intersects (e.g., vias) to interconnect the parallel planes of conductive material. That is, 3D-printed conductive paths formed within the 3D-printed PCB may have any shape in the X, Y, and Z directions, and are not constrained by parallel planes and perpendicular conductive via orientations. As a result, a 3D-printed PCB may be thinner and more efficient with respect to heat transfer through the 3D-printed PCB as compared to a laminated PCB.

As provided herein, the term "flip chip package" refers to assemblies whereby a semiconductor die, such as a microcontroller, microelectromechanical system (MEMS) or driver IC, is attached bond pad side down to a substrate or carrier. In flip chip packages, electrical connections may be created by means of a conductive bump on the die bond pad. Once the die is connected, any space between the die and substrate may be filled with a non-conductive adhesive commonly referred to as "underfill." The underfill may provide stress relief between the die and substrate, and protect electronic components from moisture ingress.

Flip chip packages may offer a number of advantages over alternate interconnection packages. For example, flip chip packages may provide higher input/output (I/O) counts, as the entire area of the die may be used for connections. Furthermore, due to the short interconnection paths used by flip chip packages, the speed of a device utilizing a flip chip package may be improved. In addition, the removal of wire bonds provides flip chip packages with a smaller form factor and increased thermal conductivity.

Traditional flip chip packages utilize a solder ball array to form electrical connections between the substrate and the die. However, the disclosed integrated power electronics packages alleviates the need for the solder ball array by connecting the substrate to the electronic components embedded in the cold plate using the 3D-printed vias of the PCB. By eliminating the solder ball array, the flip chip package utilized herein may further minimize interconnection paths, thereby increasing the speed and thermal conductivity of the disclosed integrated power electronic packages.

Embodiments of the cold plates and systems and methods of forming integrated power electronics packages will now be described in more detail herein. The following will now describe these systems, methods, and devices in more detail with reference to the drawings and where like numbers refer to like structures.

Figure 1:
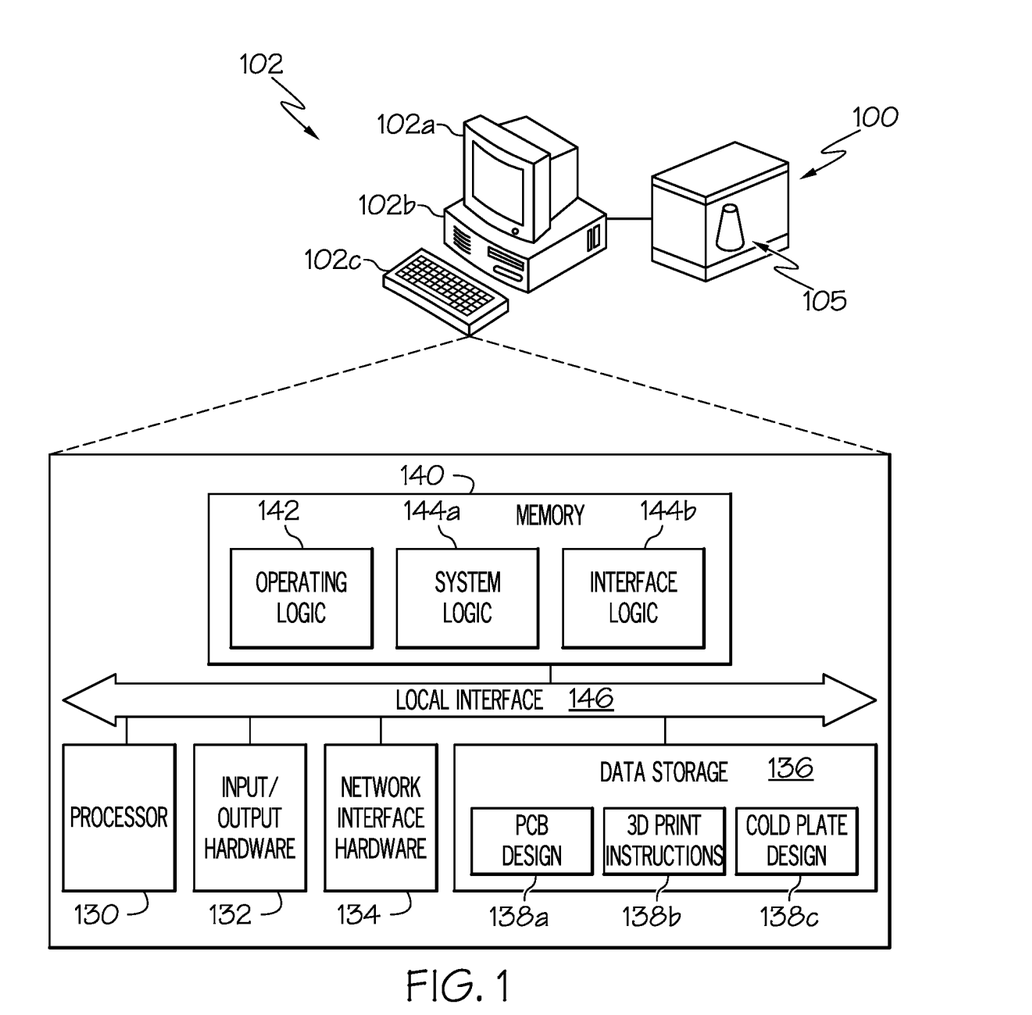
FIG. 1 depicts an illustrative system having an electronic controller for forming an integrated power electronics package by 3D-printing a control board onto a cold plate, according to one or more embodiments shown and described herein.

Referring to FIG. 1, an illustrative system 100 having an electronic controller 102 for forming an integrated power electronics package by 3D-printing a PCB onto a cold plate is illustrated. In some embodiments, the system 100 includes an electronic controller 102 such as a computing device communicatively coupled to a 3D-printer 105. The electronic controller 102 may include a display 102a, a processing unit 102b and an input device 102c, each of which may be communicatively coupled to one another. The electronic controller 102 may be a server, a personal computer, a laptop, a tablet, a smartphone, a handheld device, or a similar computing device. The electronic controller 102 may be used by a user of the system to provide information to the system. The electronic controller 102 may utilize a local application, a web application, or the like to access the 3D-printer 105 that is communicatively coupled to the electronic controller 102 as described herein. The system may also include one or more data servers (not shown) having one or more databases, from which cold plate designs, 3D-print instructions or the like (e.g., computer-aided design (CAD) files or the like) may be queried, extracted, updated, and/or utilized by the electronic controller 102.

The electronic controller 102, which is described in more detail herein, may be configured to host applications and execute processes related to the system described herein. It should be understood that while an electronic controller 102 and a 3D-printer 105 are depicted in the illustrative system 100 in FIG. 1, each of the functions and operations performed by the electronic controller 102 may be embodied and deployed in a distributed computing environment having a plurality of electronic controllers 102 and a plurality of 3D-printers 105. It is also understood that while the electronic controller 102 is depicted as a personal computer, this is merely an example. In some embodiments, any type of computing device (e.g., mobile computing device, personal computer, server, and the like) may be utilized for any of these components. Moreover, in some embodiments, the electronic controller 102 may be a component of the 3D printer 105.

The electronic controller 102 includes a processor 130, input/output hardware 132, network interface hardware 134, a data storage component 136, which may store a database of PCB designs 138a, and a database of 3D-printer instructions corresponding to one or more of the PCB designs 138a, and a memory component 140. The memory component 140 may be machine readable memory (which may also be referred to as a non-transitory processor readable memory). The memory component 140 may be configured as volatile and/or nonvolatile memory and, as such, may include random access memory (including SRAM, DRAM, and/or other types of random access memory), flash memory, registers, compact discs (CD), digital versatile discs (DVD), and/or other types of storage components. Additionally, the memory component 140 may be configured to store operating logic 142, system logic 144a for implementing one or more of the methods described herein, and interface logic 144b for implementing an interactive interface between a user and the system 100 (each of which may be embodied as a computer program, firmware, or hardware, as an example). A local interface 146 is also included in FIG. 1 and may be implemented as a bus or other interface to facilitate communication among the components of the electronic controller 102.

The processor 130 may include any processing component(s) configured to receive and execute programming instructions (such as from the data storage component 136 and/or the memory component 140). The instructions may be in the form of a machine-readable instruction set stored in the data storage component 136 and/or the memory component 140. The input/output hardware 132 may include a monitor, keyboard 102c, mouse, printer, camera, microphone, speaker, and/or other device for receiving, sending, and/or presenting data. The network interface hardware 134 may include any wired or wireless networking hardware, such as a modem, LAN port, Wi-Fi card, WiMax card, mobile communications hardware, and/or other hardware for communicating with other networks and/or devices.

It should be understood that the data storage component 136 may reside local to and/or remote from the electronic controller 102 and may be configured to store one or more pieces of data for access by the electronic controller 102 and/or other components. As illustrated in FIG. 1, the data storage component 136 may store a database of cold plate designs 138c, and a database of 3D-printer instructions corresponding to one or more of the cold plate designs 138c. The data storage component 136 also includes a database of 3D-printer instructions corresponding to one or more of the PCB designs 138a. The 3D-printer instructions may be generated by the electronic controller 102 or another computing system. The 3D-printer instructions include the specific motion and deposition instructions for a predetermined 3D-printer model such that the 3D-printer can build the PCB according to the PCB design 138a defined by a user.

The system 100 further includes a 3D-printer 105 communicatively coupled to the electronic controller 102. The 3D-printer 105 may be any rapid-prototyping, rapid manufacturing device, or additive manufacturing device such as a material jet (MJ), a binder jet (BJ), a drop on demand (DOD), fused deposition modeling (FDM), stereolithography (SLA), digital light processing (DLP), selective laser sintering (SLS), selective laser melting (SLM), laminated object manufacturing (LOM), electron beam melting (EBM), and/or the like type 3D-printer. The 3D-printer 105 may include a processor and memory and other electronic components for receiving 3D-printing instructions 138b for printing a PCB design 138a. The 3D-printing instructions 138b are a design configuration file corresponding to the PCB design 138a for printing which may be uploaded to the 3D-printer 105.

In some embodiments, the system 100 may be implemented through the interconnectivity of multiple devices, for example, through a network where the electronic controller 102 and the 3D-printer 105 may be collocated or at different locations. In other embodiments, the system 100 is implemented through an electronic controller 102 that is communicatively coupled to the 3D-printer 105. Regardless of the implementation of the system 100, the electronic controller 102 may utilize hardware, software, and/or firmware, according to embodiments shown and described herein. While in some embodiments, the electronic controller 102 may be configured as a general-purpose computer with the requisite hardware, software, and/or firmware, in some embodiments, the electronic controller 102 may be configured as a special purpose computer designed specifically for performing the functionality described herein.

Referring still to FIG. 1, the system 100 may be further configured to 3D-print a cold plate. In these embodiments, the data storage component 136 may further include a database of cold plate designs 138c and/or a database of 3D-printer instructions corresponding to the cold plate designs 138c. The 3D-printer instructions may be generated by the electronic controller 102 or another computing system. The 3D-printer instructions include the specific motion and deposition instructions for a predetermined 3D-printer model such that the 3D-printer can build the cold plate according to the cold plate design 138c defined by a user.

In embodiments in which the cold plate is 3D-printed, the electronic controller 102 may be configured to implement the 3D-printing of both the cold plate and PCB using the 3D-printer 105. In these embodiments, the 3D-printer 105 may 3D-print the cold plate prior to printing the PCB layer on to a top surface of the cold plate. Once the cold plate is formed, the electronic controller may execute the 3D-printer instructions for depositing the PCB on top of the cold plate, as described in detail herein.

Figure 2:
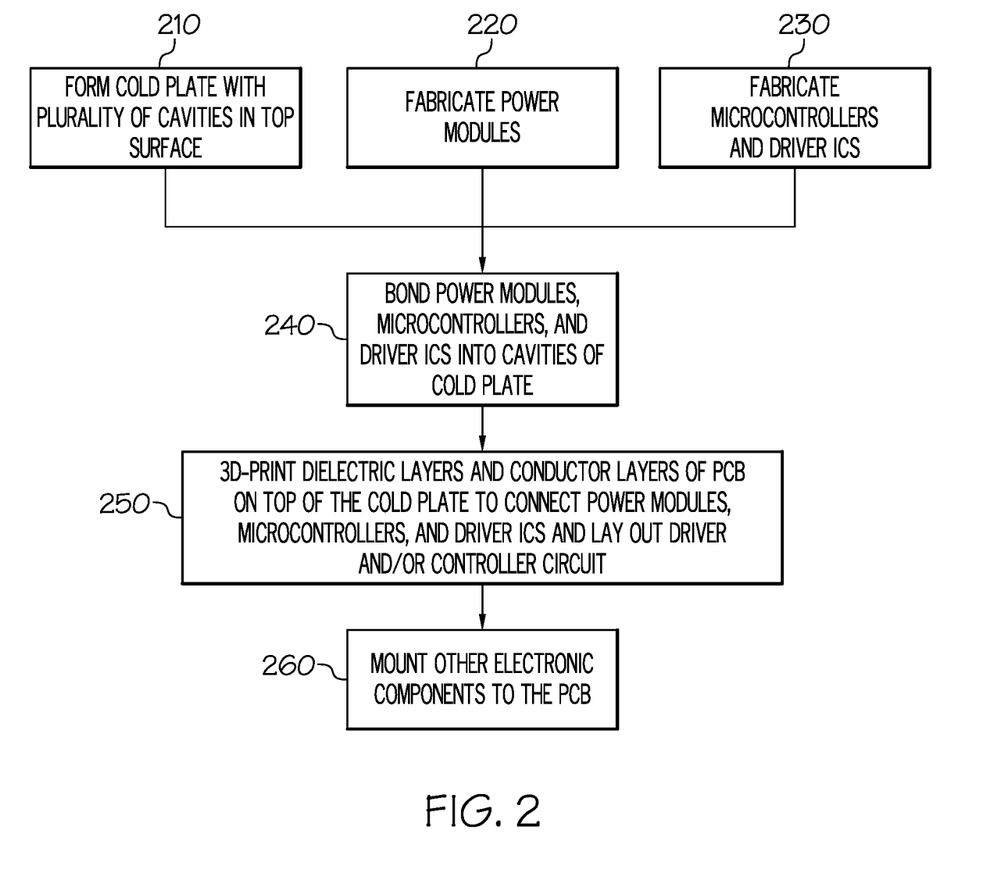
FIG. 2 depicts a flow diagram of an illustrative method for forming an integrated power electronics package by forming a cold plate, according to one or more embodiments shown and described herein.

Referring now to FIG. 2, an illustrative flow diagram of an illustrative method for forming an integrated power electronics package including a cold plate is depicted. The method described herein results in an integrated power electronics package that provides an improvement in thermal management of the power electronics integrated therein. Initially, embedding the power devices and electronic components, such as microcontrollers and driver ICs, into a top surface of the cold plate effectively enhances the cooling of these components when operated. Notably, each layer between the power devices and cold plate contribute to the overall thermal resistance of the integrated power electronics package. Thus, embedding the power devices and electronic components into the top surface of cold plate acts to minimize the number of layers present between the power devices and the cold plate, thereby decreasing the overall thermal resistance of the package.

Embodiments in which the cold plate is 3D-printed may provide additional thermal management benefits. For example, the 3D-printing method may result in a cold plate having a single, monolithic structure which does not include numerous seals and/or joints which are prone to leakage over time and inhibit the thermal management of the cold plates. By 3D-printing the cold plate as a single structure, such leakage concerns may be alleviated. Furthermore, the method of 3D-printing the cold plate allows for the utilization of geometries which may not be achievable using conventional fabrication techniques. These unique geometries may allow for an increase in the overall surface area of the cold plate, which may in turn increase the amount of heat the cold plate is able to transfer away from any embedded electronic components.

Similarly, these benefits may be achieved by forming the cold plate from a single piece of material, such as a thermally conductive material. In these embodiments, the cold plate may be formed via extrusion or another similar fabrication technique.

Additionally, the method of 3D-printing the PCB on and/or around power devices embedded within the cold plate may provide additional thermal benefits. Specifically, 3D-printing the PCB eliminates the need for grease layers and/or other thermal interface layers between the PCB and the cold plate, and acts to alleviate the need for external insulation layers. Furthermore, the 3D-printed PCB may be thinner and more efficient with respect to heat transfer than a conventionally laminated PCB.

The method 200 for forming the integrated power electronics package will now be described. Referring to block 210 of FIG. 2, the method may involve forming a cold plate such as, for example, the cold plate 300 depicted in FIGS. 3-4. In some embodiments, the cold plate 300 may be formed using conventional fabrication techniques, while in other embodiments, the cold plate 300 may be formed using a 3D-printing process.

Figure 4:
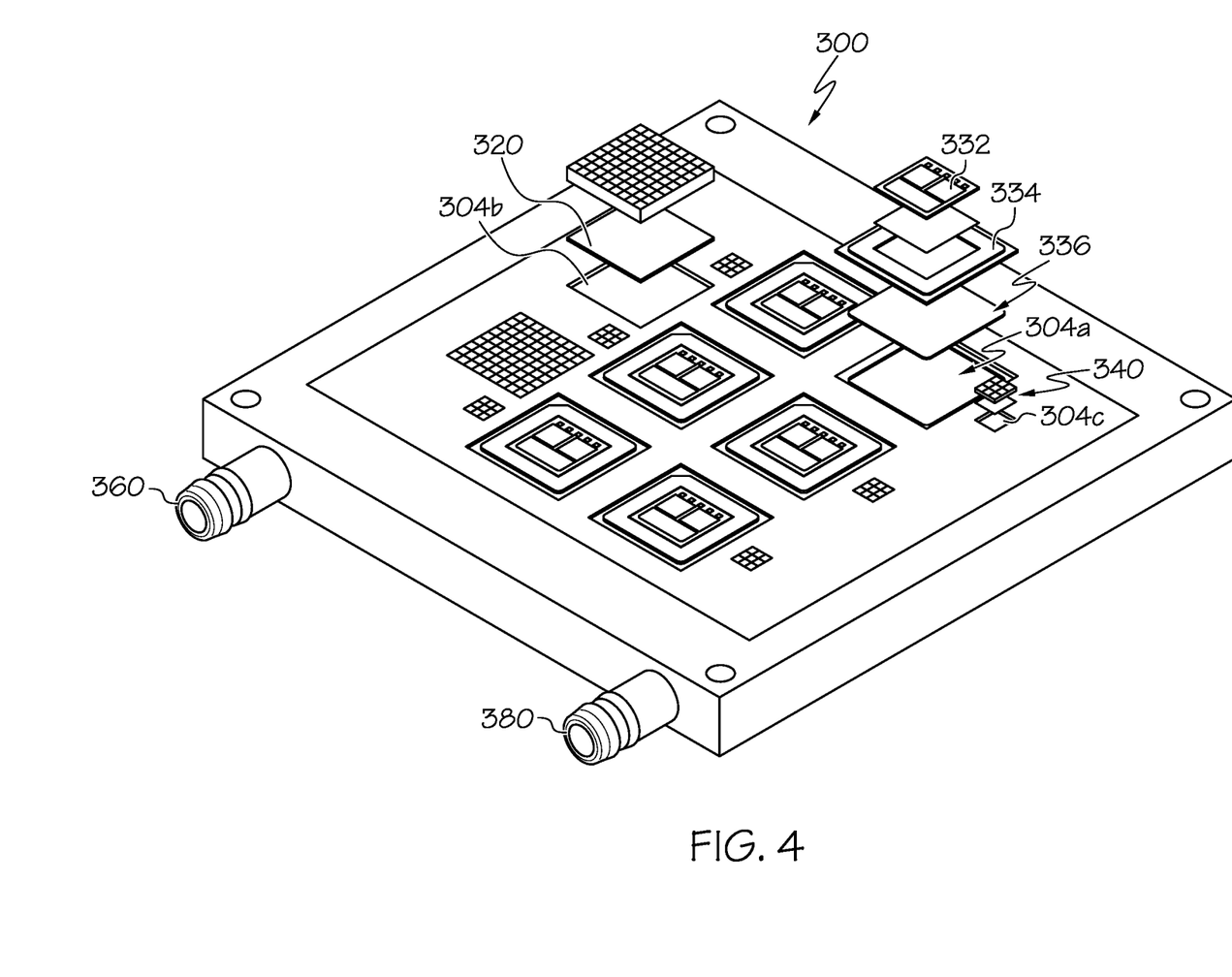
FIG. 4 depicts a partially exploded view of the cold plate of FIG. 3, according to one or more embodiments shown and described herein.

As most clearly illustrated in FIG. 4, the cold plate 300 may include a plurality of cavities 304 positioned in a top surface 302 of the cold plate 300. The plurality of cavities 304 may be sized to receive one or more power modules 330, one or more microcontrollers 320 and/or one or more driver ICs 340. For example, the plurality of cavities 304 may include power module cavities 304a sized to receive the one or more power modules 330, microcontroller cavities 304b sized to receive the one or more microcontrollers 320, and driver IC cavities 304c sized to receive the one or more driver ICs 340.

In these embodiments, the plurality of cavities 304 may be of sufficient size and depth such that the power modules 330, microcontrollers 320 and/or driver ICs 340 are embedded in the top surface 302 of the cold plate 300 when bonded to the plurality of cavities 304. For example, the power modules 330, microcontrollers 320 and/or driver ICs 340 may be embedded into the top surface 302 of the cold plate 300 such that a top surface of each component lies flush with the top surface 302 of the cold plate 300.

Figure 3:
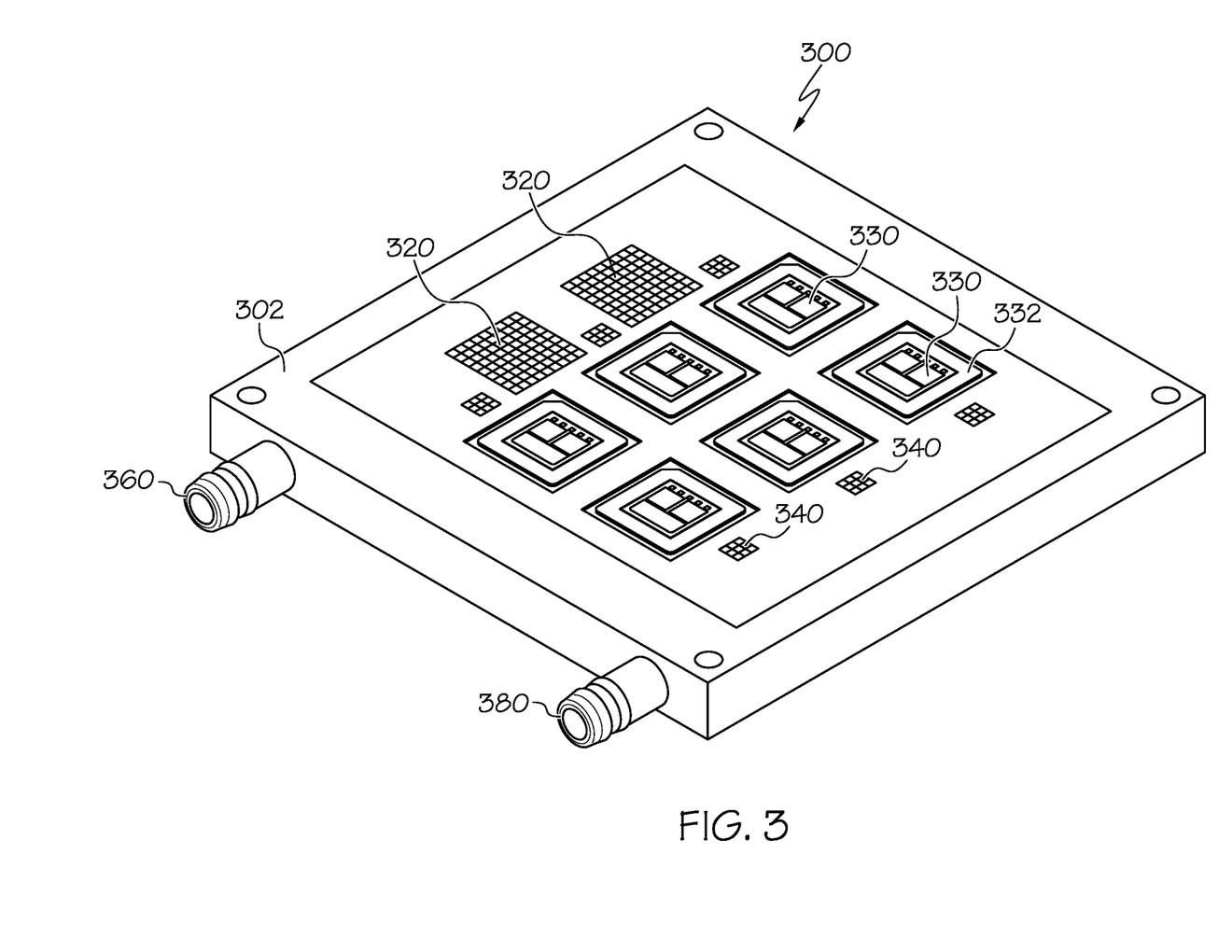
FIG. 3 depicts a perspective view of an illustrative cold plate that is formed according to one or more embodiments shown and described herein.

Referring to FIGS. 3 and 4, the cold plate 300 may further include an inlet 360 and an outlet 380, each of which may be configured to allow fluid and/or vapor, such as coolant, to pass through the 3D printed cold plate 300. For example, the coolant may enter the cold plate 300 via the inlet 360 and exit the cold plate 300 via the outlet 380.

Figure 5:
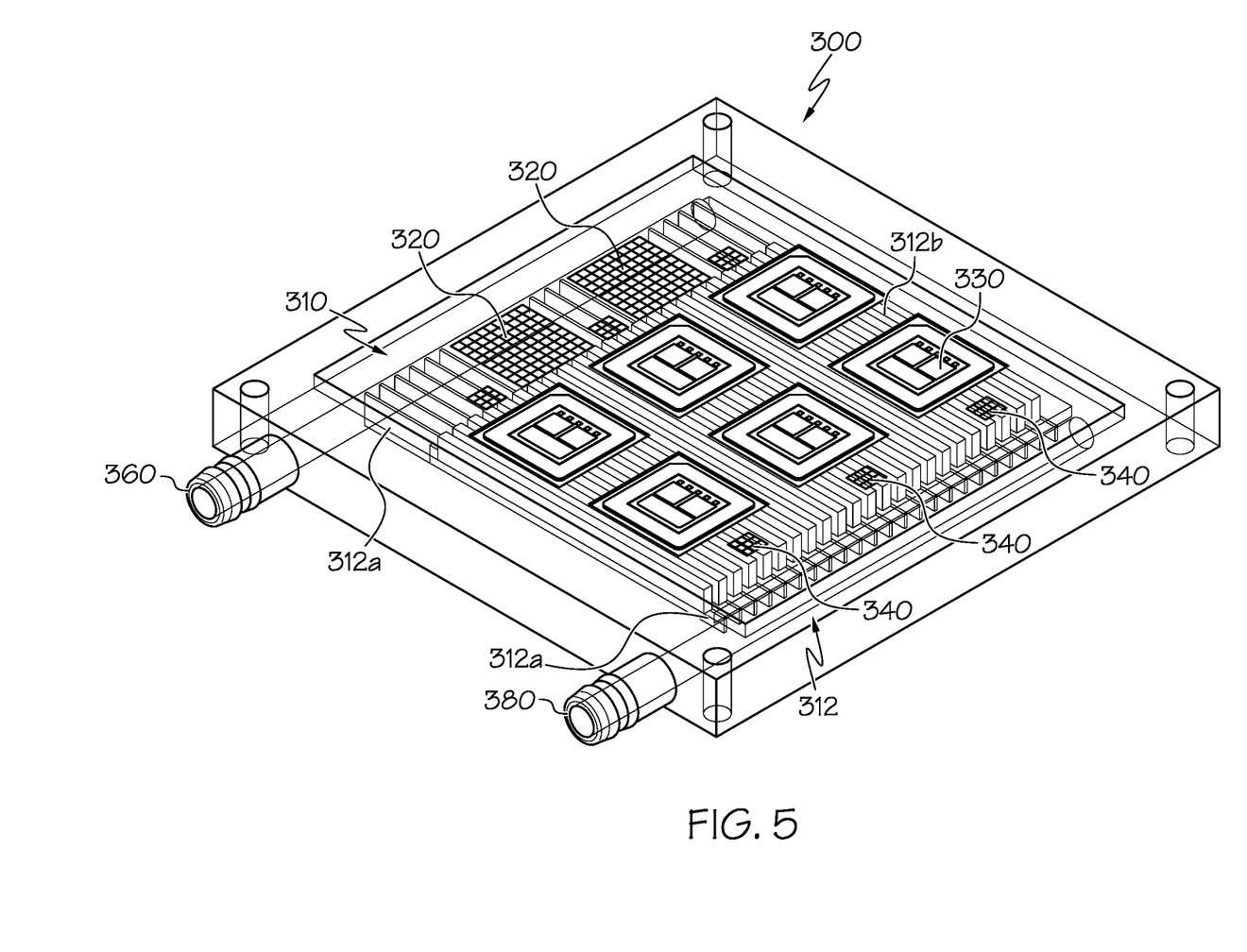
FIG. 5 depicts a transparent view of the cold plate of FIG. 3, according to one or more embodiments shown and described herein.

Turning now to FIG. 5, a partially transparent view of the cold plate 300 illustrating a hollow interior recess of the cold plate 300 is shown. As illustrated, the cold plate 300 may be formed such that the cold plate 300 includes hollow interior recess 310, which may house various cooling components, such as, for example, a plurality of fins 312. While the embodiment of FIG. 5 illustrates the cold plate 300 as including a plurality of fins 312, it should be understood that the cold plate 300 may be further designed to include other cooling components such as a plurality of straight channels, pin fins, manifold microchannel structures, and/or the like.

In embodiments in which the cold plate 300 is 3D-printed, the fins 312 may be 3D-printed as a portion of the cold plate 300, such that the fins 312 and the cold plate 300 are a single monolithic structure. In other embodiments, the fins 312 may be formed separately using traditional fabrication methods, such as machining, casting, extrusion, and other similar processes, and then bonded to the cold plate 300, and more particularly, into the hollow interior recess 310. In such embodiments, the fins 312 may be bonded to the interior recess 310 with thermally conductive epoxy, brazing, welding, or similar bonds.

In some embodiments, the cold plate 300 may include a plurality of regions, such that each region includes a plurality of fins 312 having different densities. As provided herein, the term "density" may refer to the compactness of the plurality of fins in each of the plurality of regions of the cold plate 300. For example, the plurality of fins 312 may be positioned such that the fins 312 are tightly compacted, or dense, in some regions of the cold plate 300 relative to the plurality of fins 312 that are loosely compacted, or sparse, in other regions of the cold plate 300. In these embodiments, the surface area of the plurality of fins 312 may be greatest in regions where the fins 312 are densely disposed, which may result in increased heat transfer from these regions.

In these embodiments, the cold plate 300 may be configured to have different heat exchange properties in each of the plurality of regions, which may be desirable for cooling different embedded electronic components in each of the plurality of regions. For example, FIG. 5 illustrates a plurality of sparsely disposed fins 312a positioned adjacent to the microcontrollers 320 and driver ICs 340 and a plurality of densely disposed fins 312b positioned adjacent to the power modules 330. In this embodiment, the power modules 330 may generate significantly more heat than the microcontrollers 320 and/or driver ICs 340, which increases the need for heat transfer from the power modules 330. As fluid flows through the interior recess 310 of the cold plate 300, the surface area of the fluid that comes into contact with the plurality of fins 312 will be greatest in the region corresponding to the plurality of dense fins 312b (e.g., the region adjacent to power modules 330), which in turn may increase the amount of heat transfer in the region. In these embodiments, the flow of fluid through the cold plate 300 may be optimized by controlling the density of the plurality of fins 312 in each region, which may aid in balancing heat transfer and any potential pressure drops that may occur within the interior recess 310.

Referring still to FIG. 5, the plurality fins 312 in each of the plurality of regions may be configured to enhance heat transfer in both single-phase cooling and two-phase cooling depending on the cooling application for which the cold plate 300 is needed. For example, in regions where a high degree of cooling is required, such as the cooling of one or more power modules 330, the fins 312 may be configured as two-phase cooling structures. In such a configuration, the fins 312 may be positioned adjacent the one or more power modules 330 that are embedded in the cold plate 300. Accordingly, the heat generated by the one or more power modules 330 may cause phase change of the fluid within the hollow interior recess 310 (e.g., cause the fluid to boil and transform into vapor). The fluid may undergo another phase change (e.g., vapor may condense) on surfaces within the hollow interior recess 310 or exit the interior recess 310 through the outlet 380, which fluidly couples the interior recess 310 to an external environment of the cold plate 300.

In other embodiments, the fins 312 maybe configured to provide single-phase cooling of the cold plate 300. In these embodiments, the fins 312 may be porous or solid, depending on the application. The fins 312 may allow fluid to flow relatively unrestricted within the interior recess 310 of the cold plate 300 such that heat transfer occurs via the fluid from the power modules 330, the microcontrollers 320, and/or the driver ICs 340 embedded in the cold plate 300. In a single-phase configuration, the fluid that flows through and/or around the fins 312 may increase in temperature but will generally remain in liquid form. Once the fluid flows through and/or around the fins 312, the fluid may exit the interior recess 310 of the cold plate 300 through the outlet 380.

Referring now to block 220 of FIG. 2, a sub process of assembling power modules 330 is completed so that the power modules 330 may be bonded to a depressed surface within the cavities 304 of the cold plate 300. As provided herein, the depressed surface may be a surface within the top surface 302 of the cold plate 300, and may have sufficient depth such that the power modules 330 bonded thereto lie flush with the top surface 302 of the cold plate 300. In some embodiments, the power modules 330 may include power devices 332, conductor substrates 334, and electrical insulation layers 336, as illustrated most clearly in FIG. 4. In some embodiments, the conductor substrate 334 may include a bulk copper component, or any other suitable conductor, such as an S-cell.

The electrical insulation layer 336 may be a direct bonded copper (DBC) layer. It should be understood that, in these embodiments, DBC layers are implemented for their excellent electrical insulation and good heat spreading characteristics. As such, other devices having similar or better electrical insulation and heat spreading characteristics to those of DBC layer may be implement in place of the DBC layer contemplated herein.

Furthermore, the power devices 332 may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. The power devices 332 may be formed using micro-electromechanical systems (MEMS) technology, which involves creating miniaturized mechanical and/or electro-mechanical devices (e.g., sensors, actuators, electronics, etc.) and structures using microfabrication techniques.

To form the power modules 330, the power devices 332, conductor substrates 334, and electrical insulation layer 336 may all be bonded together. In some embodiments, the conductor substrates 334 include openings for receiving the power device 332. In these embodiments, the power devices 332 may be bonded to the openings of the conductor substrates 334 using silver sintering or other bonding techniques such as transient liquid phase (TLP) bonding or the like. The conductor substrates 334 and power devices 332 may then be bonded to the electrical insulation layers 336 using similar bonding techniques. It should be noted that in other embodiments, the conductor substrates 334 and electrical insulation layers 336 may be bonded together before the power devices 332 are bonded into the openings of the conductor substrates.

Turning now to block 230 of FIG. 2, the method may further involve fabricating microcontrollers 320 and driver ICs 340. The microcontrollers 320 may be formed using conventional methods, such as very large-scale integration (VLSI) fabrication, which may involve the combination of a plurality of transistors into a single controller. The driver ICs 340 may also be formed using conventional fabrication techniques such as lithography, etching, deposition, and the like.

Once the power modules 330, microcontrollers 320 and driver ICs 340 are fabricated, the components may be bonded to the depressed surfaces of the cavities 304 of the cold plate 300 such that each of the components are embedded into the top surface 302 of the cold plate, as provided in block 240 of FIG. 2. In some embodiments, the power modules 330 may be bonded to the depressed surfaces of the cavities 304 of the cold plate 300 by bonding the electrical insulation layers 336 of the power modules 330 into the cavities 304. In these embodiments, the power modules 330 may be sintered, soldered, TLP bonded or similarly bonded to the cold plate.

Referring now to FIGS. 3-4, in some embodiments, the microcontrollers 320 and driver ICs 340 may have a flip chip packaging structure. In these embodiments, a bottom surface of the microcontrollers 320 may include a plurality of signal paths, which may include a plurality of I/O connections, while a top surface of the microcontrollers 320 may include a plurality of thermal paths. Similarly, a bottom surface of the driver ICs 340 may include a plurality of signal paths, which may include a plurality of I/O connections, while a top surface of the driver ICs may include a plurality of thermal paths.

When the microcontrollers 320 and driver ICs 340 are bonded to the depressed surfaces of the cavities 304 of the cold plate 300, the components may be flipped such that the top surface of each component (e.g., the surface including the plurality of thermal paths) is in contact with the depressed surfaces of the cavities 304. In this configuration, the bottom surface of each component (e.g., the surface including the plurality of I/O connections) faces the top surface 302 of the cold plate 300. In these embodiments, the bottom surfaces of the microcontroller 320 and driver ICs 340 may lie flush with the top surface 302 of the cold plate 300. Once the microcontrollers 320 and driver ICs are bonded to the cold plate 300, the plurality of I/O connections on the bottom surface of both the microcontrollers 320 and the driver ICs 340 may be exposed. In this configuration, the plurality of I/O connections may be connected to the power modules 330 and 3D-printed PCB by way of a plurality of 3D-printed vias.

The flip chip packaging structure described herein provides a number of benefits over conventional interconnection packages, such as traditional QFP or BGA packages. Notably, these conventional packages include thermal paths and signal paths on the same surface of the package. In these packages, electrical wiring may be required to connect the signal paths to a circuit board. Furthermore, additional cooling may be required to effectively transfer heat from the thermal paths. The additional wiring may greatly increase the inductance of the package, which in turn reduces how efficiently heat may be dissipated from the package. These issues are alleviated by providing the microcontrollers 320 and driver ICs 340 in a flip chip package, which involves isolating the thermal paths and signal paths on separate surfaces, as described herein. By isolating the paths on separate surfaces, the thermal paths of the microcontrollers 320 and driver ICs 340 may be able to benefit from the heat transfer provided by fluid flowing through the interior recess 310 of the cold plate, which may reduce the need for additional cooling. At the same, the signal paths of the microcontrollers 320 and driver ICs 340 may remain exposed, such that the paths may be connected to the power modules 330 and 3D-printed PCB via 3D-printed vias, thereby eliminating the need for any additional electrical wiring.

The flip chip packaging of the microcontrollers 320 and driver ICs 340 further serves to eliminate the need for a solder ball array, which is commonly used in conventional flip chip packages to create electrical connections between a control circuit and/or power devices and the signal paths of the packages. By 3D-printing the PCB directly onto the top surface 302 of the cold plate 300, seamless electrical connections may be created between the plurality of I/O connections on both the microcontrollers 320 and driver ICs 340. By exchanging the conventional solder ball array with 3D-printed vias, the flip chip package described herein may further reduce inductance of the package, which may in turn increase the heat transfer efficiency throughout the package.

Figure 6:
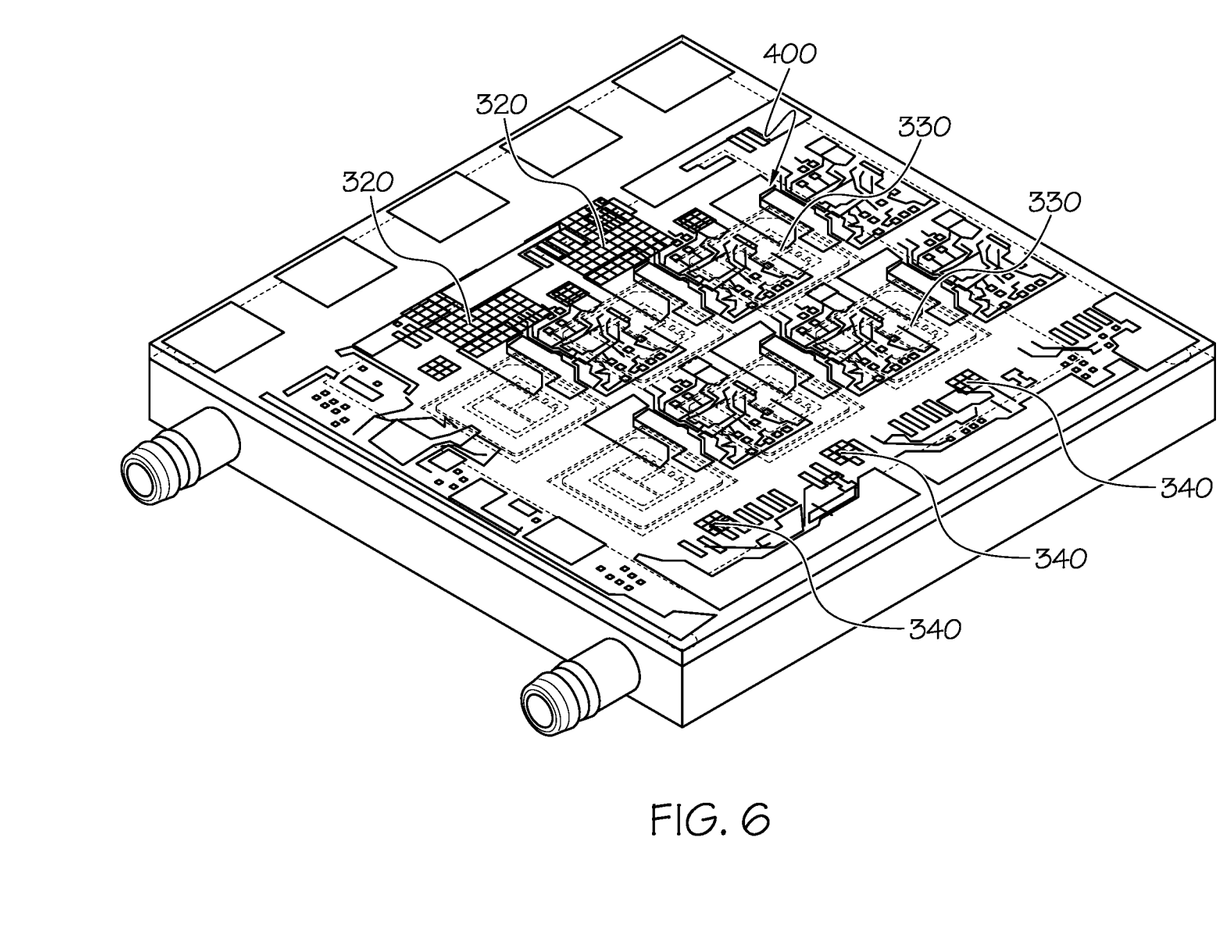
FIG. 6 depicts a perspective view of the cold plate of FIG. 3 with a 3D-printed circuit board, according to one or more embodiments shown and described herein.

Once the microcontrollers 320, driver ICs 340, and power modules 330 have been embedded in the cold plate 300, the method illustrated by FIG. 2 may further involve 3D-printing a PCB 400 on and/or around the power modules 330 embedded into the cold plate 300, as shown at block 250 and in FIG. 6. The PCB 400 may include a plurality of conductive portions and insulation portions, which are 3D-printed on and/or around the microcontrollers 320, driver ICs 340, and power modules 330. The conductive portions may include a plurality of conductive paths configured to interconnect the microcontrollers 320, driver ICs 340, and power modules 330 of the cold plate 300 together. Additionally, the conductive portions may further include a plurality of conductive pads, which, in combination with the conductive paths, enable electrical connection from components mounted on the cold plate 300 to the microcontrollers 320, driver ICs 340, and power modules 330 embedded within the cold plate 300.

It is understood that since the PCB 400 is 3D-printed, the conductive pads of the printed PCB 400 do not include interceding insulation layers or the formation of vias formed using laser drilling or other machining and electroplating techniques. As such, the PCB 400 may be formed directly on the cold plate 300 and on and/or around the microcontrollers 320, driver ICs 340, and power modules 330 that are embedded. This may effectively eliminate the added processing steps of machining cavities within a laminated PCB for receiving the power modules 330 and/or laser drilling and electroplating to form electric and/or thermal conductive vias.

In addition, by printing conductive portions with a 3D-printer, the process of printing the conductive material may include directly printing on the electrical connections of the microcontrollers 320, driver ICs 340, and power modules 330, thereby forming seamless electrical connections from the components to the conductive paths formed within the printed PCB 400. Conventional methods of forming a PCB are restricted to the layer-by-layer processes associated with lamination, which involves placing a plurality of relatively small vias between conductive layers within a PCB to provide electrical and/or thermal conductive paths. In contrast, a 3D-printed PCB 400 may be formed with a single large conductive portion, which reduces the electrical and thermal resistance paths within the PCB 400 and enables the seamless electrical connections described herein.

Although the method of FIG. 2 contemplates bonding the power modules 330, microcontrollers 320 and driver ICs 340 into the cold plate 300 (block 240) and then 3D-printing the PCB 400 on and/or around the power modules 330, microcontrollers 320 and driver ICs 340 (block 250), it should be understood that these steps may be completed in either order. For example, the PCB 400 may first be formed around a portion of the power modules 330, microcontrollers 320, and/or driver ICs 340, after which the components are bonded to the cold plate 300.

Once the PCB 400 has been 3D-printed onto the cold plate, the method of FIG. 2 may further include mounting additional electrical components 500 to the PCB 400, as shown at block 260. In some embodiments, one or more passive and/or active electrical components 500 are mounted on the 3D-printed PCB 400. The electrical components 500 may be mounted on the PCB 400 using a pick-and-place operation or manually soldered thereon. The electrical components 500 may further provide logic control and/or switching functionality to and from the power modules 330, microcontrollers 320, and driver ICs 340 embedded within the cold plate 300.

Figure 7:
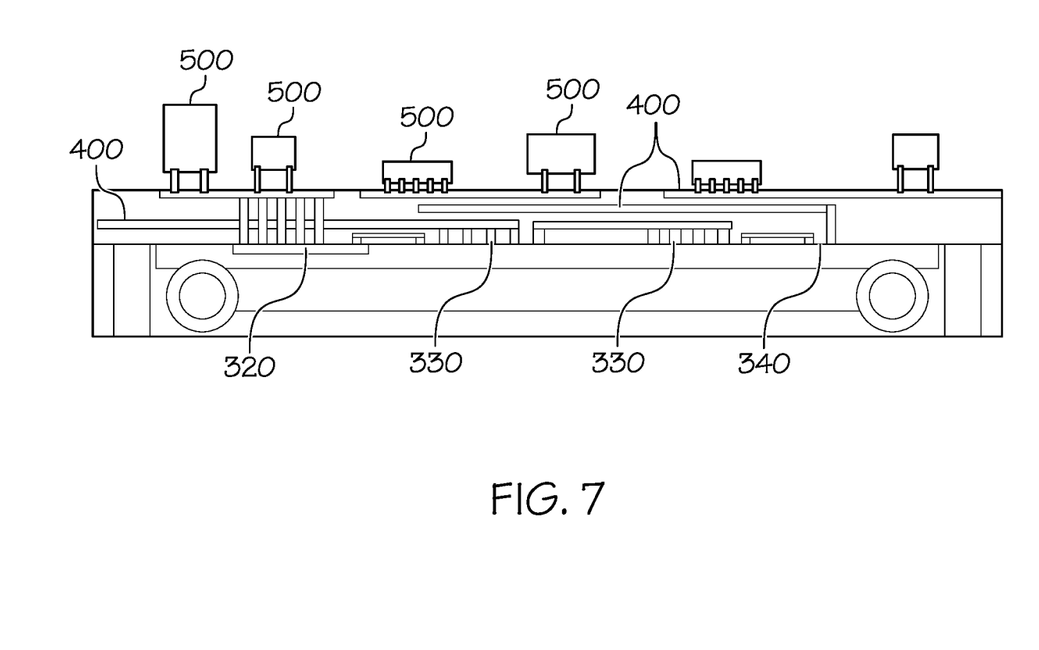
FIG. 7 depicts a flip chip packaging structure used to connect the 3D-printed circuit board with the cold plate, according to one or more embodiments described herein.

FIG. 7 depicts a side view of a cold plate 300 formed according to the methods described herein. The cold plate 300 includes power modules 330, microcontrollers 320, and driver ICs 340 embedded in the top surface 302 of the cold plate 300. In this embodiment, the microcontrollers 320 and driver ICs 340 include a flip chip package structure, as described herein. The cold plate 300 further includes a 3D-printed PCB 400, which is printed on and/or around the microcontrollers 320, driver ICs 340, and power modules 330. As can be seen in FIG. 7, the 3D-printed vias serve to provide electrical connection between the microcontrollers 320, driver ICs 340, and power modules 330, such that additional interconnection components, such as conventional solder ball arrays, are not required. Electrical components 500 are mounted to the 3D-printed PCB 400, which further acts to provide an electrical connection between the electrical components 500 and the microcontrollers 320, driver ICs 340, and power modules 330.

As should be appreciated in view of the foregoing, a device stack comprising a cold plate is described herein. The cold plate may include a top surface having a plurality of cavities for receiving electronic components. In some embodiments, the plurality of cavities may be configured to receive power modules, microcontrollers, and/or driver ICs. In these embodiments, the plurality of cavities may be of variable size and depth, such that the power modules, microcontrollers, and/or driver ICs may be embedded within the top surface of the cold plate when the components are bonded into the plurality of cavities. The power modules may include a conductor substrate, an electrical insulation layer, and a power device, which may each be bonded together to form the power module prior to bonding the power module into the plurality of cavities in the top surface of the cold plate. In some embodiments, the microcontroller and driver ICs may include a flip chip packaging structure. In these embodiments, the bottom surface of the microcontrollers and the driver ICs may include a plurality of signal paths, which may have a plurality of I/O connections. The top surface of the microcontrollers and the driver ICs may include a plurality of thermal paths. The microcontrollers and driver ICs may be bonded to the cold plate such that the top surfaces of the microcontrollers and driver ICs are in contact with the plurality of cavities, while the bottom surfaces of the microcontrollers and driver ICs lie flush with the top surface of the cold plate. In some embodiments, the cold plate may include a plurality of regions, and a plurality of fins having varying densities may be provided within the hollow interior recess adjacent to each of the plurality of regions. In these embodiments, the plurality of regions that contain electrical components requiring less heat transfer may include a plurality of sparse fins, while regions that contain electrical components requiring more heat transfer may include a plurality of dense fins. The cold plate may further include an inlet and an outlet, both of which may be fluidly coupled to the hollow interior recess of the cold plate. Fluid may flow into the inlet and through the plurality of fins positioned in the interior recess, drawing heat from the electrical components embedded in the cold plate before exiting the interior recess via the outlet. A 3D-printed PCB may be provided on the top surface of the cold plate, and additional electrical components may be mounted onto the 3D-printed PCB. The cold plate may further include a hollow interior recess, which may include a plurality of fins. A method of forming an integrated power electronics package is also contemplated. The method may involve fabricating a cold plate having a plurality of cavities for receiving electronic components. The method may further involve separately fabricating power modules, which may include bonding together a conductor substrate, an electrical insulation later, and a power device. Furthermore, the method may involve separately fabricating a microcontroller and a driver IC. Once the components are fabricated, the power modules, microcontrollers, and driver ICs may be bonded into the plurality of cavities, such that the components are embedded in the cold plate. A 3D-printed PCB may then be printed on a top surface of the cold plate on and/or around the power modules, microcontrollers, and driver ICs. The method may finally involve mounting additional electrical components onto the 3D-printed PCB.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A device comprising:
   a cold plate comprising a surface and a plurality of cavities formed in the surface;
   a plurality of power electronics, each one of the plurality of power electronics disposed within a corresponding one of the plurality of cavities; and
   a 3D-printed circuit board coupled to the surface of the cold plate and to the plurality of power electronics, such that a bottom surface of the 3D-printed circuit board directly contacts each of the plurality of power electronics disposed within the plurality of cavities.

2. The device of claim 1, wherein the plurality of power electronics comprises at least one microcontroller, at least one integrated circuit board, and at least one power module.

3. The device of claim 2, wherein the at least one power module comprises a conductor substrate, an electrical insulation layer, and a power device.

4. The device of claim 2, wherein the at least one microcontroller comprises a flip chip package structure.

5. The device of claim 2, wherein the at least one integrated circuit comprises a flip chip package structure.

6. The device of claim 1, wherein the cold plate further comprises a hollow interior recess.

7. The device of claim 6, wherein the cold plate further comprises an inlet and an outlet fluidly coupled to the hollow interior recess.

8. The device of claim 7, wherein a plurality of fins are positioned within the hollow interior recess.

9. The device of claim 8, wherein the plurality of fins are positioned within the hollow interior recess in a plurality of regions, such that each of the plurality of regions includes a plurality of fins having varying compactness.

10. The device of claim 1, further comprising one or more electrical components coupled to the 3D-printed circuit board.

11. A device comprising:
- a cold plate having a plurality of power electronics embedded in a top surface of the cold plate;
- a hollow interior recess positioned beneath the top surface of the cold plate;
- a plurality of fins positioned within the hollow interior recess of the cold plate;
- a 3D-printed circuit board coupled to the surface of the cold plate and to the plurality of power electronics, such that a bottom surface of the 3D-printed circuit board directly contacts each of the plurality of power electronics embedded within the top surface of the cold plate;
- an inlet and an outlet fluidly coupled to the hollow interior recess of the cold plate;
- wherein the compactness of the plurality of fins varies throughout the hollow interior recess of the cold plate.

12. The device of claim 11, wherein the plurality of power electronics comprise at least one microcontroller, at least one integrated circuit, and at least one power module which are connected via a 3D-printed circuit board formed on the top surface of the cold plate.

13. The device of claim 12, further comprising one or more electrical components mounted to the 3D-printed circuit board.

14. The device of claim 11, wherein the at least one power module comprises a conductor substrate, an electrical insulation layer, and a power device.

15. The device of claim 11, wherein the at least one microcontroller comprises a flip chip package structure.

16. The device of claim 11, wherein the at least one integrated circuit comprises a flip chip package structure.

* * * * *